US006806027B2

(12) United States Patent
Hohle et al.

(10) Patent No.: US 6,806,027 B2
(45) Date of Patent: Oct. 19, 2004

(54) CHEMICALLY AMPLIFIED PHOTORESIST AND PROCESS FOR STRUCTURING SUBSTITUENTS USING TRANSPARENCY ENHANCEMENT OF RESIST COPOLYMERS FOR 157 NM PHOTOLITHOGRAPHY THROUGH THE USE OF FLUORINATED CINNAMIC ACID DERIVATIVES

(75) Inventors: Christoph Hohle, Bubenreuth (DE); Jörg Rottstegge, Erlangen (DE); Christian Eschbaumer, Schwaig (DE); Michael Sebald, Weisendorf (DE)

(73) Assignee: Infineon Technologies AG, Munich (DE)

( * ) Notice: Subject to any disclaimer, the term of this patent is extended or adjusted under 35 U.S.C. 154(b) by 91 days.

(21) Appl. No.: 10/208,326

(22) Filed: Jul. 30, 2002

(65) Prior Publication Data

US 2003/0096190 A1 May 22, 2003

(30) Foreign Application Priority Data

Jul. 30, 2001 (DE) .......................................... 101 37 100

(51) Int. Cl.$^7$ .............................. G03F 7/004; G03F 7/26
(52) U.S. Cl. .................... 430/270.1; 430/322; 430/323; 430/905; 430/907
(58) Field of Search ...................... 430/270.1, 905, 430/907, 322, 323

(56) References Cited

U.S. PATENT DOCUMENTS

| 5,234,793 A | 8/1993 | Sebald et al. |
| 5,324,794 A | 6/1994 | Taka et al. |
| 6,120,972 A | 9/2000 | Iwanaga et al. |
| 6,312,870 B1 * | 11/2001 | Malik et al. ............. 430/270.1 |
| 6,376,149 B1 * | 4/2002 | Grober et al. .............. 430/139 |

FOREIGN PATENT DOCUMENTS

| EP | 0 395 917 A2 | 11/1990 |
| EP | 0 689 098 A1 | 12/1995 |

OTHER PUBLICATIONS

Hohle et al., "Novel Fluoro Copolymers for 157 nm Photoresists—A Progress Report", Proceedings of SPIE–The Internal Society for Optical Engineering, vol. 4690 (2002), 41–50.*
Myers et al., "Development of Decarboxylative Palladation Reaction and its use in a Heck–type Olefination of Arene Carboxylates", Journal of American Chemical Society, 2002, 124, 11250–11251. See Table 1, entries 9 and 10.*
Email verification of Publication date from SPIE Customer Service Representative.*
Kyle Patterson et al.: "Polymers for 157 nm Photoresist Applications: A Progress Report", *Proc. of SPIE vol. 3999, Advances in Resist Technology and Processing XVIII, ed. F. Houlihan, Mar. 2000, pp. 365–374.*

* cited by examiner

Primary Examiner—Yvette C. Thornton
(74) Attorney, Agent, or Firm—Laurence A. Greenberg; Werner H. Stemer; Ralph E. Locher

(57) ABSTRACT

Chemically amplified photoresists exhibit increased transparency at a wavelength of 157 nm. The chemically amplified photoresist includes a polymer containing first repeating units derived from a cinnamic acid or a cinnamic ester, which are at least monofluorinated or substituted by fluoroalkyl groups. Processes for structuring substituents using transparency enhancement of resist copolymers for 157 nm photolithography using fluorinated cinnamic acid derivatives are also included.

14 Claims, No Drawings

CHEMICALLY AMPLIFIED PHOTORESIST AND PROCESS FOR STRUCTURING SUBSTITUENTS USING TRANSPARENCY ENHANCEMENT OF RESIST COPOLYMERS FOR 157 NM PHOTOLITHOGRAPHY THROUGH THE USE OF FLUORINATED CINNAMIC ACID DERIVATIVES

BACKGROUND OF THE INVENTION

FIELD OF THE INVENTION

The invention relates to a chemically amplified photoresist that is particularly suitable for exposure with light having a wavelength of 157 nm, and to a process for structuring substrates, especially silicon wafers.

In order to raise the calculating speed of processors and the capacity of memory elements, and to reduce the costs of the components, the semiconductor industry is developing chips having ever smaller features and hence an ever increasing density of components. One particular challenge is reducing the minimum feature size. In optical lithography, these requirements have been met to date through the transition to ever shorter wavelengths. However, at a feature size of 100 to 70 nm, the existing processes, which use wavelengths as short as 193 nm, approach the limit of their resolution. Consequently, the development of new processes is needed. Particularly good prospects for industrial use are possessed by optical lithography where exposure is carried out using radiation with a wavelength of 157 nm, since in this case the chip manufacturers are able to continue utilizing their extensive knowledge of optical lithography. A key difficulty in the use of an exposure radiation having a wavelength of 157 nm is the insufficient transparency of the presently used materials. For industrial application, the transparency of the base polymer in these high-resolution resists must be as high as possible, while the photochemicals with which, for example, an acid is produced in the resist must have a high quantum yield.

Some of the resists presently used for the manufacture of microchips operate with what is known as chemical amplification. In such resists, exposure in a photoreaction changes the chemical structure of the resist. In the case of a positive-working chemically amplified resist, for example, exposure generates a strong acid that brings about catalytic conversion or cleavage of the resist in a subsequent heating step. As a result of this chemical reaction, the solubility of the polymer in a developer is drastically changed, so that a marked differentiation between exposed and unexposed areas is possible.

The structured (i.e. patterned) photoresists can be used as masks for further operations, such as dry etching operations, for instance. Where the photoresist is used to structure an underlying organic-chemical medium, such as in two-layer resists, the topmost photoresist layer is required to have a high etch resistance. To this end, either the photoresist may contain corresponding etch-resistant groups in the polymer chain, such as silicon-containing groups, or the photoresist is reinforced in terms of its etch resistance in the step following the structuring of the photoresist. For this purpose, the polymer must contain reactive groups as anchor groups. These groups then react with a suitable reactive group of an amplifying reagent, which acts as a linking group, to form a chemical bond. In this way, silicon-containing or aromatic groups can be introduced subsequently into the polymer. The etch resistance of aromatic and organosilicon compounds in an oxygen plasma is much higher than that of aliphatic organic hydrocarbon compounds. Especially for structured resists with a low layer thickness, therefore, subsequent amplification of the resist structures is advantageous. The reaction incorporating organosilicon compounds is often referred to as silylation, the incorporation of aromatic compounds as aromatization.

A process for consolidating structured resists is described, for example, in commonly-owned European Patent EP 0 395 917 B1, which corresponds to U.S. Pat. Nos. 5,234,794 and 5,234,793. In that process, the photoresists used for an exposure wavelength of 248 and 193 nm following their structuring, are chemically reinforced in terms of their etch resistance by incorporating organosilicon groups to form a sufficiently stable etch mask. Where the layer thickness of the resist is sufficient, the structures of the resist can be widened by lateral growth and in that way it is possible to obtain an improvement in the resolution.

As already mentioned, the low transparency of the known photoresists at a wavelength of 157 nm poses a key difficulty in the development of the 157 nm technology. With the existing photoresists, layer thicknesses of approximately 50 nm can be realized. Presently, photoresists are being developed in which fluorination improves the transparency of the polymer at a wavelength of 157 nm. See Patterson et al., Proc. SPIE, 3999 (2000). However, these polymers still have an absorption that is about 50 times higher than that of the polymers commonly used at present in the resists used in industry for exposure with radiation having a wavelength of 193 or 248 nm. Even with these highly fluorinated polymers, layer thicknesses of only about 200 nm are achieved.

Besides high transparency at a wavelength of 157 nm, in order to be useful industrially the resists must meet further requirements, such as, for example, high contrast, good film-forming properties and good developability in conjunction with low basic solubility (dark erosion). Furthermore, the photoresist polymers ought to be very easy to prepare, in order to prevent complex preparation processes that increase the costs of the photoresist.

SUMMARY OF THE INVENTION

It is accordingly an object of the invention to provide chemically amplified photoresist and process for structuring substituents using transparency enhancement of resist copolymers for 157 nm photolithography through the use of fluorinated cinnamic acid derivatives that overcome the hereinafore-mentioned disadvantages of the heretofore-known devices of this general type and that provide photoresists having high transparency at a wavelength of 157 nm, high contrast, good film-forming properties and good developability in conjunction with low basic solubility (dark erosion). Furthermore, the photoresist polymers should be very easy to prepare and not require complex preparation processes that increase the costs of the photoresist.

With the foregoing and other objects in view, there is provided, in accordance with the invention, a chemically amplified photoresist including a polymer, a photoacid generator, and a solvent. The polymer contains acid-labile groups that are eliminated under the action of an acid and that liberate polar groups that increase the solubility of the polymer in aqueous alkaline developers. The polymer has first repeating units derived from cinnamic acid or cinnamic esters that are at least monofluorinated and/or substituted by fluoroalkyl groups.

Through the introduction of a first repeating unit derived from an at least partly fluorinated and/or fluoroalkyl-substituted cinnamic acid or cinnamic ester into the polymer, the transparency of the photoresist of the invention is significantly increased; this permits higher layer thicknesses of the photoresist. The aryl units of the cinnamic acid groups considerably raise the etch resistance in the plasma etch operation. Furthermore, with the carboxyl group of the cinnamic acid, a reactive group is introduced at the same time into the polymer. The carboxyl group allows subsequent modification of the photoresist. The incorporation of an at least partly fluorinated cinnamic acid or an at least partly fluorinated cinnamic ester allows a plurality of functions to be introduced into the polymer. In turn, this makes it possible to circumvent the often complicated copolymerization of monofunctional monomers whose copolymerizability with one another is poor. Through the introduction of an at least partly fluorinated and/or fluoroalkyl-substituted cinnamic acid into the photoresist polymer, the following advantages are gained.

a) Fluorination raises the transparency of the photoresist at an exposure wavelength of 157 nm.

b) The introduction of aryl groups into the polymer raises the resistance of the resist toward an etch plasma.

c) The introduction of a carboxyl group, which may also be esterified, provides a group that is able to change its polarity strongly by ester cleavage. Furthermore, the carboxyl group may act as an anchor group, which allows modification of the properties of the polymer and of the photoresist in a consolidation reaction.

The at least partly fluorinated and/or fluoroalkyl-substituted cinnamic acid introduced into the polymer in accordance with the invention has a free-radically polymerizable double bond. It is therefore very easy to integrate into the synthesis of polymers that are already known for use in photoresists, so that adapting known photoresists to lithographic structuring with short-wavelength light can be accomplished with comparative ease.

The other components of the photoresist are already known in general. For instance, as photoacid generators it is possible to use all compounds that liberate acid on irradiation. Use is made advantageously of onium compounds, as described, for example, in commonly-owned European Patent Application No. EP 0 955 562 A1. Preferred photoacid generators are ionic compounds in the form of sulfonium salts and iodonium salts.

Solvents that can be used for the resist include methoxypropyl acetate, cyclopentanone, cyclohexanone, γ-butyrolactone, ethyl lactate, diethylene glycol, diethyl ether, ethylene glycol dimethyl ether, dimethyl ether, or a mixture of at least two of these solvents. In general, however, all common solvents or mixtures thereof can be used in which the resist components can be dissolved to form a clear, homogeneous, and storage- stable solution and which ensure good coat quality when the substrate is coated.

In addition to the components stated, the photoresist may further include additional compounds. For instance, the photoresist may additionally include a thermoacid generator. Suitable thermoacid generators include, for instance, benzylthiolanium compounds.

Further components which can be added as additives are those which influence the resist system advantageously in respect of resolution, film-forming properties, storage stability, radiation sensitivity, service life, etc.

The polymer present in the photoresist of the invention contains, pendantly, acid-labile groups that confer on the polymer a low solubility in polar solvents. By the catalytic action of acid and, where appropriate, a simultaneous temperature treatment, polar groups are produced on the polymer. Examples of acid-labile groups that can be used include the following: tert-alkyl ester, tert-butoxycarbonyloxy, tetrahydrofuranyl, tetrahydro-pyranyl, tert-butyl ether, lactone, and acetal groups. Tert-butyl ester groups are particularly preferred.

These acid-labile groups are preferably at least partly fluorinated; i.e., one or more of the hydrogen atoms present in the groups are substituted by fluorine atoms. In that case, carboxyl groups and/or hydroxyl groups act as polar groups that are liberated following elimination of the acid-labile groups, if corresponding monomers have been copolymerized.

With the objects of the invention in view, there is also provided a process for structuring substrates. The first step is coating a substrate with a photoresist as described above to produce a photoresist film. The next step is exposing sectionally the photoresist film to light having a wavelength less than 200 nm. The next step is developing the exposed photoresist film is developed to form a structure from the developed photoresist. The next step is transferring the structure to the substrate.

In accordance with a further object of the invention, the process includes first applying a bottom resist to the substrate. A subsequent step is applying the photoresist to the bottom resist.

In accordance with a further object of the invention, during the exposing step, the photoresist film is exposed to light having a wavelength of 157 nm.

Other features that are considered as characteristic for the invention are set forth in the appended claims.

Although the invention is illustrated and described herein as embodied in chemically amplified photoresist and process for structuring substituents using transparency enhancement of resist copolymers for 157 nm photolithography through the use of fluorinated cinnamic acid derivatives, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments and examples.

DESCRIPTION OF THE PREFERRED EMBODIMENTS

In the resist of the invention, the components described can be used in the following proportions:

film-forming polymer: 1–50% by weight, preferably 2–20% by weight;

photoacid generator: 0.001–10% by weight, preferably 0.001–0.1% by weight; and solvent: 50–99% by weight, preferably 88–98% by weight.

The repeating unit derived from the at least partly fluorinated cinnamic acid is represented by the following formula I:

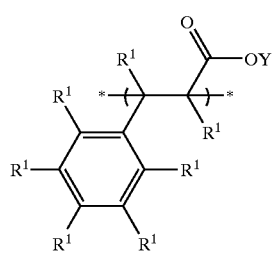

Formula I where Y is a hydrogen atom or an arbitrary group, an alkyl group having from 1 to 6 carbon atoms, for example, which may be partly or fully fluorinated. With particular preference, Y is an acid-labile group, such as one of the acid-labile groups mentioned above. $R^i$, independently for each position, is in each case hydrogen, fluorine, or an alkyl group having from 1 to 6 carbon atoms, which may also be partly or fully fluorinated, in particular a trifluoromethyl group. At least one of the radicals $R^1$ must include a fluorine atom.

The first repeating units derived from the at least partly fluorinated cinnamic acid are preferably in the form of acid-labile esters. As acid-labile group it is possible, for example, to use the acid-labile groups mentioned above. Particular preference is given to using a tert-butyl ester group. By esterification with an acid-labile group the first repeating unit can be used for differentiating the photoresist between exposed and unexposed areas. In this way the synthesis of the polymer present in the photoresist can be simplified further, since it is not necessary per se to introduce into the polymer any further repeating units which carry an acid-labile group.

Where the first repeating unit derived from an at least partly fluorinated cinnamic acid is esterified with an acid-labile group, it may also act as an anchor group in a consolidation reaction. For this purpose the photoresist is first exposed as described above, amplified and developed, to give a structured resist. In the unexposed areas, which form the lines of the structured resist, the carboxyl groups of the first repeating unit are still protected by the acid-labile groups. These acid-labile groups can now likewise be eliminated, thereby liberating the carboxyl groups. This can be done, for example, by subjecting the structured resist to flood exposure followed by heat treatment. It is also possible, however, to provide a thermoacid generator in the resist, benzylthiolanium compounds for example, and to heat the structured resist to a temperature at which the acid is liberated and the acid-labile groups are eliminated. An amplifying agent, preferably in solution, containing a basic group, an amino group for example, is applied to the structured photoresist thus treated. The free carboxyl group of the polymer reacts with the amino group of the amplifying agent to form an ammonium salt. Consequently, the amplifying agent is fixed in the photoresist by an ionic bond. If the amplified, structured photoresist is subsequently heated, such as in a drying step, for example, then an amide bond may be formed with elimination of water, so that the amplifying agent is fixed by a covalent bond. However, for consolidation of the structured resist, fixing of the amplifying agent by an ionic bond is sufficient.

In order to allow subsequent increasing of the layer thickness and a widening of resist structures, as is described, for example, in commonly-owned European Patent EP 0 395 917 B1, which corresponds to U.S. Pat. Nos. 5,234,794 and 5,234,793, the polymer preferably includes second repeating units that include reactive anchor groups. "Reactive anchor group" means an anchor group that is can react with an amplifying agent to form a chemical bond without having first to be liberated or activated. The amplifying agent contains a suitable linking group, an amino group for example, with which it is able to react with the reactive anchor group. In this case, groups are incorporated which contain aromatic or silicon-containing groups, as a result of which the etch resistance of the structured photoresist can be increased. Where the amplifying agent includes at least two linking groups, two amino groups, for example, it is also possible through the consolidation reaction to bring about a further crosslinking of the polymer. Groups selected as reactive anchor groups are those that have sufficient reactivity to be subjected to the consolidation reaction within a period that is acceptable for industrial applications. The reactive anchor group is preferably selected from the group including acid anhydride, epoxide, and/or ketene. It is also possible for different reactive anchor groups to be present in the polymer.

With particular preference, the second repeating units are derived from unsaturated carboxylic anhydrides. The carboxylic anhydrides are introduced into the photoresist polymer by copolymerization with the at least partly fluorinated cinnamic acid derivative. The carboxylic anhydrides must therefore have a polymerizable double bond. Examples of suitable comonomers are maleic anhydride, itaconic anhydride, methacrylic anhydride, cyclohexenedicarboxylic anhydride, and norbornenedicarboxylic anhydride.

The fraction of the first repeating units that are derived from at least partly fluorinated cinnamic acid derivatives may be chosen freely within wide ranges. However, in order to achieve a sufficient enhancement of the transparency at a wavelength of 157 nm, the fraction of the first repeating units in the polymer that are derived from at least monofluorinated cinnamic acid preferably will be chosen to be greater than 20 mol %, with particular preference between 30 and 50 mol %.

In principle, a large number of suitable monomers are available for introducing the first repeating units derived from at least partly fluorinated cinnamic acid. In this context it is also possible to use different at least partly fluorinated cinnamic acid derivatives for preparing the polymer. Preference, however, is given to those cinnamic acid derivatives that are easy to prepare industrially and are therefore obtainable inexpensively. Preferably, therefore, the first repeating unit is derived from an at least monofluorinated cinnamic acid selected from the group including 3-trifluoromethylcinnamic acid, perfluorophenylcinnamic acid, and perfluorocinnamic acid. Similarly, for the introduction of the second repeating unit that includes a reactive anchor group, it is also preferred to have recourse to those monomers that are easily obtainable. Preference is given to using maleic anhydride for introducing the second repeating unit.

The increased transparency of the photoresist of the invention for light of very short wavelength makes it possible to produce structures having dimensions of less than 100 nm. Accordingly, the invention also provides a process for structuring substrates, in which the substrate is coated with the above-described photoresist to give a photoresist film. The photoresist film is sectionally exposed to light having a wavelength of less than 200 nm and the exposed photoresist film is then developed, giving a structure in the photoresist. The structure is subsequently transferred to the substrate.

The photoresist of the invention may per se be applied directly to the substrate. Preferably, a bottom resist is applied first. An exemplary material for the bottom resist is novolac. The photosensitive coat of the photoresist of the invention is then applied to the bottom resist. Radiation of very short wavelength possesses only a low level of depth definition. With the aid of the bottom resist it is possible to avoid unevennesses in the layer of photoresist, so that the structure can be sharply imaged.

The process of the invention is implemented in a procedure in which first of all the photoresist described above is applied by common techniques to the substrate, by spin coating, spraying or dipping techniques, for example. Thereafter, the solvent can be removed by heating the substrate with the resist film. The substrate used is advantageously a silicon wafer, in which components may also have already been integrated.

This is followed by exposure of the photoresist film, for which it is again possible to employ the common techniques. Exposure can be carried out, for example, with a photomask or else by interference techniques or by direct irradiation with focused electrons or ions. Exposure is carried out using light with a very short wavelength. The photoresist film is preferably exposed with light having a wavelength of 157 nm. In the exposed areas, an acid is liberated from the photoacid generator of the photoresist, forming a latent image of the desired structure. Following the exposure of the resist film, a contrasting step is carried out in which the latent image is amplified and is impressed into the polymer of the photoresist. For this purpose, the substrate with the exposed resist film is heated, generally to a temperature of 80 to 200° C. Under the catalytic influence of the acid, the acid-labile groups are eliminated from the polymer and the polar groups are liberated. Likewise, the polymer now has a high polarity and thus a high solubility in polar solvents and, respectively, a low solubility in apolar solvents. The chemical profile is developed using an aqueous alkaline developer solution: for example, with a 2.38% strength solution of tetramethylammonium hydroxide in water. As a result, the exposed areas are dissolved away and a positive relief pattern is produced in the resist film. The substrate is now bare at the exposed areas, while the unexposed areas are still protected by the solid resist film. At this point the structured resist can if appropriate be reinforced in terms of its etch resistance, using, for example, the abovementioned process of European Patent EP 0 395 017 B1, which corresponds to U.S. Pat. No. 5,089,083. After that, the structure is transferred into the substrate. This can be done by employing common etch techniques. With particular preference, the transfer of the structure into the substrate takes place by using a dry plasma etch technique.

EXAMPLE

General Working Instructions

A) Preparation of Partly Fluorinated or Perfluorinated Cinnamic Acid Alkyl Esters 1 mol of the cinnamoyl chloride corresponding to the ester to be prepared is dissolved in 1.5 l of anhydrous diethyl ether and the solution is cooled to 0° C. under inert gas. Subsequently, 1.1 mol of the corresponding partly fluorinated or perfluorinated lithium alkoxide in 1 l of diethyl ether are added dropwise at a rate such that the temperature remains below 5° C. Following the addition, the mixture is heated under reflux at a boil for 3 hours, then cooled to room temperature and added to 2 l of water. The organic phase is separated and extracted with twice 100 ml of water and the combined organic phases are dried over sodium sulfate. The solvent is distilled and the residue is purified by vacuum distillation or, in the case of solid esters, by recrystallization.

In this way, the following at least partly fluorinated cinnamic esters were obtained:

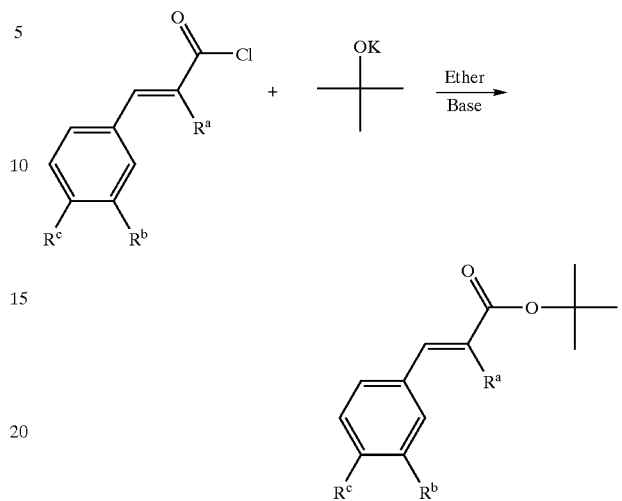

$R^a$=H, F;

$R^b$, $R^c$=F,CF$_3$

TABLE 1

Synthesized Monomeric Fluorinated Cinnamic Esters

| | $R^a$ | $R^b$ | $R^c$ |
|---|---|---|---|
| 3-F-tBuCA | H | F | H |
| 4-F-tBuCA | H | H | F |
| 3-CF$_3$-tBuCA | H | CF$_3$ | H |
| 4-CF$_3$-tBuCA | H | H | CF3 |
| a-F-tBuCA | F | H | H |

B) Copolymerization of the Partly Fluorinated or Perfluorinated Cinnamic Acid Alkyl Esters with Maleic Anhydride The monomers obtained under A) are weighed with maleic anhydride in different weight fractions and polymerized with azobisisobutyronitrile (AIBN, 1 mol %) in butanone for 24 hours. The (co)polymers obtained are precipitated a number of times from heptane and are dried to constant weight under reduced pressure.

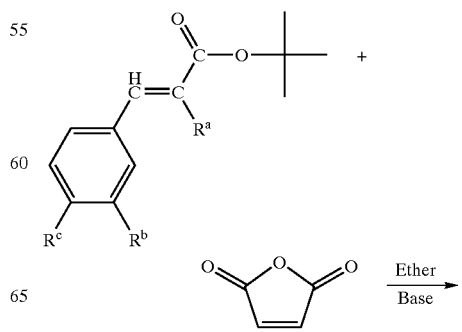

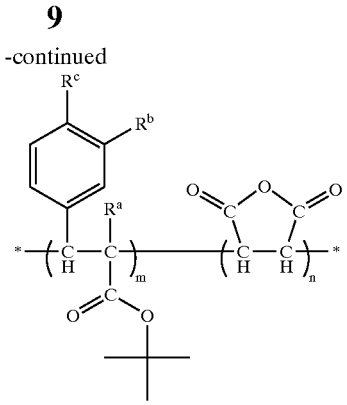

In this way the following copolymers were obtained:

TABLE 2

| | Synthesized Comonomers | | |
|---|---|---|---|
| | m (mol %) | n (mol %) | $a_{157\ nm}$ ($\mu m^{-1}$) |
| 4-F-tBuCA | 100 | 0 | 8.17 |
| | 50 | 50 | |
| | 30 | 70 | |
| 3-CF$_3$-tBuCA | 100 | 0 | 6.37 |
| | 75 | 25 | |
| | 50 | 50 | |
| 4-CF$_3$-tBuCA | 100 | 0 | |
| | 50 | 50 | |
| a-F-tBuCA | 100 | 0 | |
| | 50 | 50 | |

C) Measurement of the Absorbance of the Polymers.

Solutions of the polymers prepared under b) (5% by weight in ethylene glycol dimethyl ether) were prepared and subjected to measurement at 157 nm. The absorbances are listed in Table 2.

We Claim:

1. A chemically amplified photoresist, comprising:
a polymer containing acid-labile groups to be eliminated by an acid and polar groups liberated by said acid-labile groups after exposure to the acid, said polar groups upon being liberated increasing solubility of said polymer in aqueous alkaline developers, said polymer having repeating units derived from the group consisting of monofluorinated cinnamic acid, cinnamic acid substituted by fluoroalkyl groups, monofluorinated cinnamic esters, and cinnamic esters substituted by fluoroalkyl groups;
a photoacid generator; and
a solvent.

2. The photoresist according to claim 1, wherein said repeating units derived from cinnamic esters are acid-labile esters.

3. The photoresist according to claim 1, wherein said polymer includes further repeating units having reactive anchor groups.

4. The photoresist according to claim 3, wherein said reactive anchor groups are selected from the group consisting of acid anhydrides, epoxides, and ketenes.

5. The photoresist according to claim 3, wherein said further repeating units are obtained by copolymerizing unsaturated carboxylic anhydrides.

6. The photoresist according to claim 5, wherein said carboxylic anhydrides are selected from the group consisting of maleic anhydrides, norbornenedicarboxylic anhydrides, cyclohexenedicarboxylic anhydrides, and methacrylic anhydrides.

7. The photoresist according to claim 5, wherein said further repeating units are at least partly fluorinated.

8. The photoresist according to claim 1, wherein a fraction of said repeating units in said polymer having been derived from an at least monofluorinated cinnamic acid and an at least monofluorinated cinnamic ester is more than 20 mol %.

9. The photoresist according to claim 8, wherein said fraction of said repeating units in said polymer having been derived from said at least monofluorinated cinnamic acid and said at least monofluorinated cirnamic ester is between 30 and 50 mol %.

10. The photoresist according to claim 3, wherein:
said repeating units are derived from an at least monofluorinated cinnamic acid; and
said further repeating units are derived from maleic anhydride.

11. The photoresist according to claim 3, wherein:
said repeating units are derived fluoroalkyl-substituted cinnamic acid; and
said further repeating units are derived from maleic arhydride.

12. A process for structuring substrates, which comprises:
coating a substrate with a photoresist to produce a photoresist film, the photoresist including a polymer containing acid-labile groups to be eliminated by an acid and polar groups liberated by the acid-labile groups after exposure to the acid, the polar groups upon being liberated increasing solubility of the polymer in aqueous alkaline developers, the polymer having repeating units derived from the group consisting of monofluorinated cinnamic acid, cinnamic acid substituted by fluoroalkyl groups, monofluorinated cinnamic esters, and cinnamic esters substituted by fluoroalkyl groups, a photoacid generator, and a solvent;
exposing sectionally the photoresist film to light having a wavelength less than 200 nm;
developing the exposed photoresist film to form a structure from the developed photoresist; and
transferring the structure to the substrate.

13. The process according to claim 12, which further comprises:
first applying a bottom resist to the substrate; and
applying the photoresist to the bottom resist.

14. The process according to claim 12, which further comprises, during the exposing step, exposing the photoresist film to light having a wavelength of 157 nm.

* * * * *